United States Patent [19]

Nakai

[11] Patent Number: 5,470,760
[45] Date of Patent: Nov. 28, 1995

[54] SOLID STATE IMAGING DEVICE HAVING PARTITION WALL FOR PARTITIONING BOTTOM PORTIONS OF MICRO LENSES AND MANUFACTURING METHOD THEREFOR

[75] Inventor: Junichi Nakai, Fukuyama, Japan

[73] Assignee: Sharp Kabushiki Kaisha, Osaka, Japan

[21] Appl. No.: 344,506

[22] Filed: Nov. 23, 1994

Related U.S. Application Data

[62] Division of Ser. No. 195,756, Feb. 14, 1994, Pat. No. 5,396,090.

[30] Foreign Application Priority Data

Feb. 17, 1993 [JP] Japan ..................... 5-27864

[51] Int. Cl.$^6$ ................................. H01L 31/18
[52] U.S. Cl. ............. 437/2; 437/3; 437/4; 437/225
[58] Field of Search .................. 437/2, 3, 4, 5, 437/225, 247, 248; 136/256, 257

[56] References Cited

U.S. PATENT DOCUMENTS

| | | | |
|---|---|---|---|
| 4,879,250 | 11/1989 | Chan | 437/3 |
| 5,028,547 | 7/1991 | Iizuka et al. | 437/2 |
| 5,132,251 | 7/1992 | Kim et al. | 437/225 |
| 5,185,272 | 2/1993 | Makiuchi et al. | 437/5 |
| 5,234,860 | 8/1993 | Gluck | 437/3 |
| 5,238,856 | 8/1993 | Tokumitsu | 437/4 |
| 5,266,501 | 11/1993 | Imai | 437/2 |

FOREIGN PATENT DOCUMENTS

| | | | |
|---|---|---|---|
| 63-155002 | 6/1988 | Japan | 437/2 |
| 1-7562 | 1/1989 | Japan | 437/2 |

*Primary Examiner*—Kevin M. Picardat
*Attorney, Agent, or Firm*—David G. Conlin; Kevin J. Fournier

[57] ABSTRACT

A solid state imaging device capable of efficiently collecting incident light onto its photodetecting portions and a method for manufacturing the device are provided. A plurality of photodetecting portions and an electric charge transfer portion are formed on a surface of a semiconductor substrate, and a flattening layer which has a light transmitting property and serves to cover the plural number of photodetecting portions and the electric charge transfer portion is formed. A partition wall material layer for covering the flattening layer is formed, and a plurality of approximately rectangular regions of the partition wall material layer are removed to form a partition wall. Then a thermosoftening resin layer which has a light transmitting property and serves to cover the flattening layer and the partition wall is formed. A region of the thermosoftening resin layer covering the partition wall is removed to form a rectangular parallelepiped thermosoftening resin block corresponding to each photodetecting portion. The thermosoftening resin block is softened by heat application to be thermally transformed into a plurality of micro lenses of which bottom portions are peripherally partitioned by the partition wall.

1 Claim, 5 Drawing Sheets

SOLID STATE IMAGING DEVICE HAVING PARTITION WALL FOR PARTITIONING BOTTOM PORTIONS OF MICRO LENSES AND MANUFACTURING METHOD THEREFOR

This is a divisional of application Ser. No. 08/195,756, filed on Feb. 14, 1994, now U.S. Pat. No. 5,396,090.

BACKGROUND OF THE INVENTION

1. Field of the Invention

The present invention relates to a solid state imaging device provided with a micro lens and a method for manufacturing the device.

2. Description of the Prior Art

Generally, a solid state imaging device has on its semiconductor substrate both a photodetecting portion and an electric charge transfer portion for transferring electric charges in the photodetecting portion. Therefore, a photodetecting side surface of the semiconductor substrate cannot be used entirely as a photodetecting portion. For the above reason, there is a recent scheme to optically refract light which is about to be incident on the electric charge transfer portion and make the light be incident on the photodetecting portion to thereby increase the light incident on the photodetecting portion and thereby enhance the sensitivity of a solid state imaging device.

A method for manufacturing such a solid state imaging device is shown in FIGS. 2(a) through 2(d) (Japanese Patent Publication No. SHO 60-59752). First, in a manner as shown in FIG. 2(a), there is formed a flattening layer 4 which covers a photodetecting portion 2 and an electric charge transfer portion 3 formed on a semiconductor substrate 1 to flatten the surface. Then, in a manner as shown in FIG. 2(b), a thermosoftening resin having a photosensitivity is coated on the flattening layer 4 to form a thermosoftening resin layer 6, and an upper surface of the thermosoftening resin layer 6 is covered with a photomask 11 to perform photo-etching. By so doing, as shown in FIG. 2(c), each portion of the thermosoftening resin layer 6 to serve as a boundary between micro lenses above the electric charge transfer portion 3 is removed to form rectangular parallelepiped thermosoftening resin blocks 61. Subsequently, in a manner as shown in FIG. 2(d), the thermosoftening resin block 61 is heated so that corner portions of the block 61 are softened to be thermally transformed to thereby form an approximately hemispheric micro lens 62.

Another manufacturing method is shown in FIGS. 3(a) through 3(e) (Japanese Patent Laid-Open Publication No. SHO 60-60757). First, in a manner as shown in FIG. 3(a), there is formed a flattening layer 4 which covers a photodetecting portion 2 and an electric charge transfer portion 3 formed on a semiconductor substrate 1 to flatten the surface. Then, in a manner as shown in FIG. 3(b), an optically high refractive index material layer 16 having a high optical refractive index is formed on the flattening layer 4. Then, in a manner as shown in FIG. 3(c), a photoresist layer 12 is formed on the high refractive index material layer 16, and each region of the photoresist layer 12 corresponding to the electric charge transfer portion 3 is removed by photoetching to form a block 121 composed of a rectangular parallelepiped photoresist corresponding to the photodetecting portion 2. Subsequently, in a manner as shown in FIG. 3(d), the block 121 is heated so that corner portions of the block 121 are softened to be thermally transformed to form an approximately hemispheric block 122 composed of the photoresist. Then the high refractive index material layer 16 is subjected to anisotropic etching with the approximately hemispheric block 122 which is composed of the photoresist used as a mask to form an approximately hemispheric micro lens 161 as shown in FIG. 3(e).

According to either of the above-mentioned two methods, the rectangular parallelepiped thermosoftening resin block 61 or the rectangular parallelepiped photoresist block 121 is heated to be thermally transformed into approximately hemispheric micro lens 62 or block 122, and therefore the following problem takes place. In detail, according to the former manufacturing method, when the rectangular parallelepiped block 61 composed of a thermosoftening resin as shown in FIG. 4(a) is heated to be thermally transformed into a micro lens, corners of the bottom surface of the resulting micro lens 62 are slightly rounded by the surface tension of the thermosoftening resin. For the above reason, as shown in FIG. 4(b), the area of an ineffective region A (indicated by hatching) where incident light is not used effectively becomes greater than an idealistic ineffective region B as shown in FIG. 4(c) to have a reduced sensitivity. The above-mentioned phenomenon becomes more significant according as the micro lens is made finer because the influence of the surface tension of the resin increases.

In order to increase the light collection quantity of the micro lens 62, the gaps between a plurality of micro lenses 62 are required to be reduced as far as possible. However, there is a limitation in thermal fluidity of the thermosoftening resin and post-etching control of line width, heating temperature, and the like, and therefore it is difficult to reduce the gap between adjacent micro lenses 62 below 1.0 µm. The above fact also causes the problem that the area ratio of the gap regions between micro lenses with respect to the entire photodetecting surface increases to have a reduced sensitivity according as the micro lens of the solid state imaging device is made finer.

According to the latter manufacturing method, the rectangular parallelepiped block 121 composed of the photoresist is also heated to be thermally transformed into the approximately hemispheric block 122 composed of the photoresist. Therefore, the corners of the bottom surface of the approximately hemispheric block 122 are slightly rounded. For the above reason, the corners of the bottom surface of the resulting micro lens 161 are slightly rounded to cause the same problem as that of the former manufacturing method.

SUMMARY OF THE INVENTION

The object of the present invention is therefore to provide a solid state imaging device capable of efficiently collecting incident light onto a photodetecting portion by making the corners of the bottom surface of each micro lens less rounded and arranging the micro lenses as close as possible to each other.

In order to achieve the aforementioned object, the present invention provides a solid state imaging device having a plurality of photodetecting portions formed on a substrate, an electric charge transfer portion which is formed on the substrate and serves to transfer electric charges of the plurality of photodetecting portions, and a plurality of micro lenses for collecting incident light onto the plurality of photodetecting portions, the solid state imaging device comprising a partition wall which is provided between peripheries of bottom portions of adjacent ones of the plurality of micro lenses for partitioning the micro lenses.

It is preferred that the partition wall be colored.

The present invention also provides a solid state imaging device manufacturing method comprising the steps of: forming a plurality of photodetecting portions and an electric charge transfer portion on a substrate; forming a flattening layer which has a light transmitting property and serves to cover the plurality of photodetecting portions and the electric charge transfer portion; forming a partition wall material layer for covering the flattening layer; removing a plurality of approximately polygonal regions of the partition wall material layer corresponding to micro lens to form a partition wall; forming a resin layer which has a thermosoftening property and a light transmitting property and serves to cover the flattening layer and the partition wall; separating the resin layer into a plurality of blocks corresponding to the plurality of photodetecting portions by removing a region of the resin layer covering the partition wall; and thermally softening the plurality of blocks by heat application to transform the blocks into the plurality of micro lenses of which bottom portions are partitioned by the partition wall.

According to the solid state imaging device having the aforementioned construction, the bottom portion of each micro lens is peripherally partitioned by the partition wall. Therefore, the bottom portion of each micro lens is shaped so as to fit close to interior surfaces of the partition wall, with which the area of the region where no micro lens is existing can be reduced, and light to be projected on the electric charge transfer portion can be efficiently collected to the photodetecting portions to thereby allow the sensitivity to be improved. Furthermore, the gap between adjacent micro lenses can be reduced to the width of the partition wall, with which the gap between micro lenses can be easily reduced more than is achieved in the conventional example to allow the efficiency of collecting light onto the photodetecting portions to be increased to thereby enhance the sensitivity.

When the partition wall is colored, light incident on the partition wall is absorbed to prevent the possible entrance of unnecessary light into the adjacent photodetecting portions. With the above-mentioned arrangement, a solid state imaging device enabling a high quality display can be achieved.

According to the aforementioned solid state imaging device manufacturing method, a plurality of photodetecting portions and an electric charge transfer portion are formed on a substrate, and after forming a flattening layer which has a light transmitting property and serves to cover the plural number of photodetecting portions and the electric charge transfer portion, a partition wall material layer for covering the flattening layer is formed. Then a plurality of approximately polygonal regions of the partition wall material layer corresponding to the micro lenses are removed to form a partition wall. Subsequently, a resin layer which has a thermosoftening property and a light transmitting property and serves to cover the flattening layer and the partition wall is formed, and the resin layer is separated into a plurality of blocks corresponding to photodetecting portions by removing the region of the resin layer covering the partition wall. The plural number of blocks are softened by heat application to be thermally transformed into a plurality of micro lenses. In the above time, the periphery of the bottom portion of each micro lens adheres to the partition wall due to the intermolecular attraction force. Therefore, by reducing the width of the partition wall, the area of the region where no micro lens is existing can be reduced. Furthermore, since the micro lenses are partitioned by the partition wall, even when there is a nonuniformity in fluidity of the resin or a nonuniformity in heating temperature control, the periphery of the micro lens can be correctly defined without nonuniformity, and moreover the gap between adjacent micro lenses can be reduced to increase the light collection efficiency to allow the sensitivity to be enhanced. Furthermore, fine and uniformed micro lenses can be manufactured to allow a high quality image to be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes in detail a solid state imaging device in accordance with an embodiment of the present invention.

Figure 1:
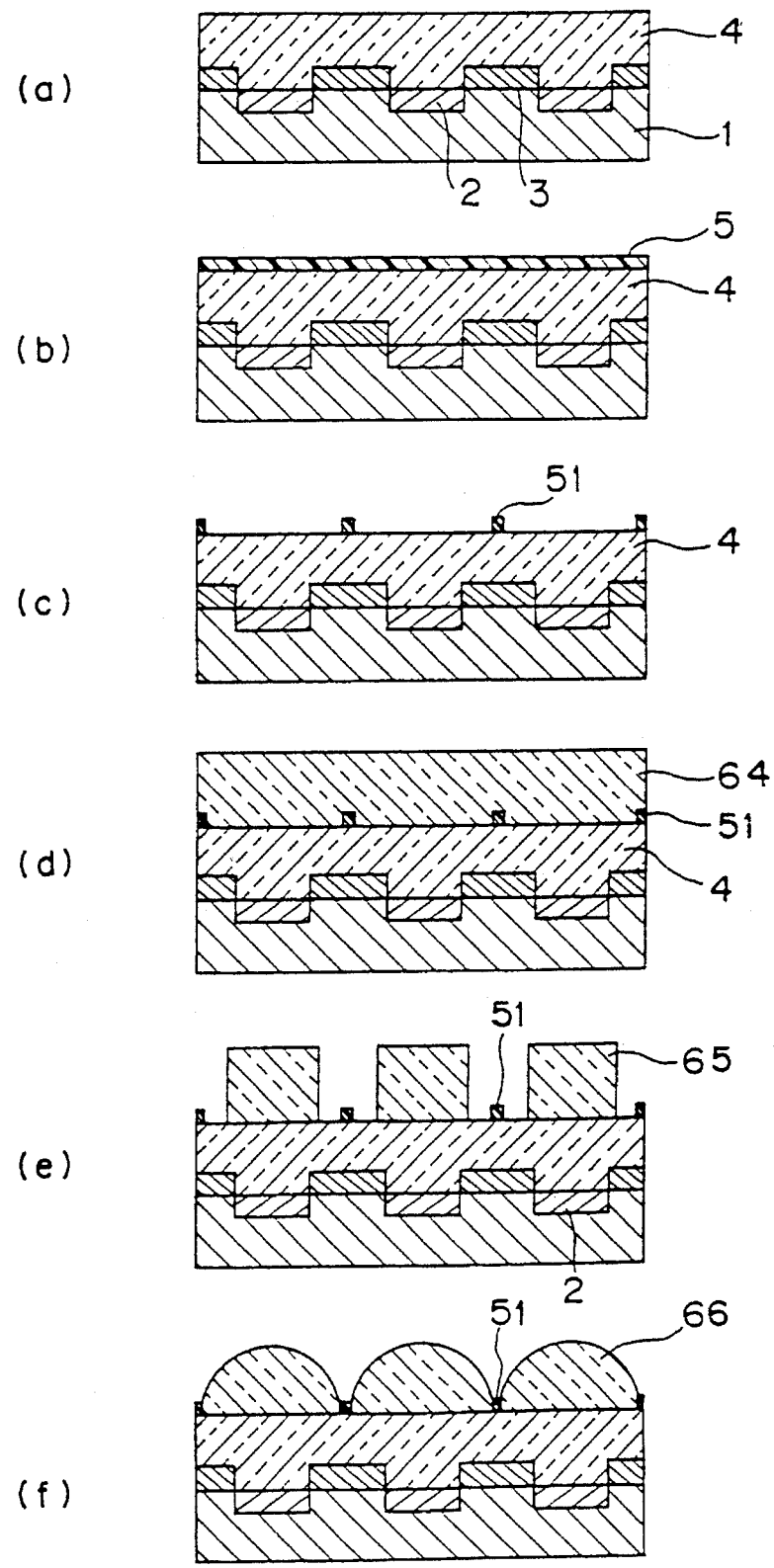
FIG. 1 is a process drawing showing a solid state imaging device manufacturing method in accordance with an embodiment of the present invention.
Figure 2:
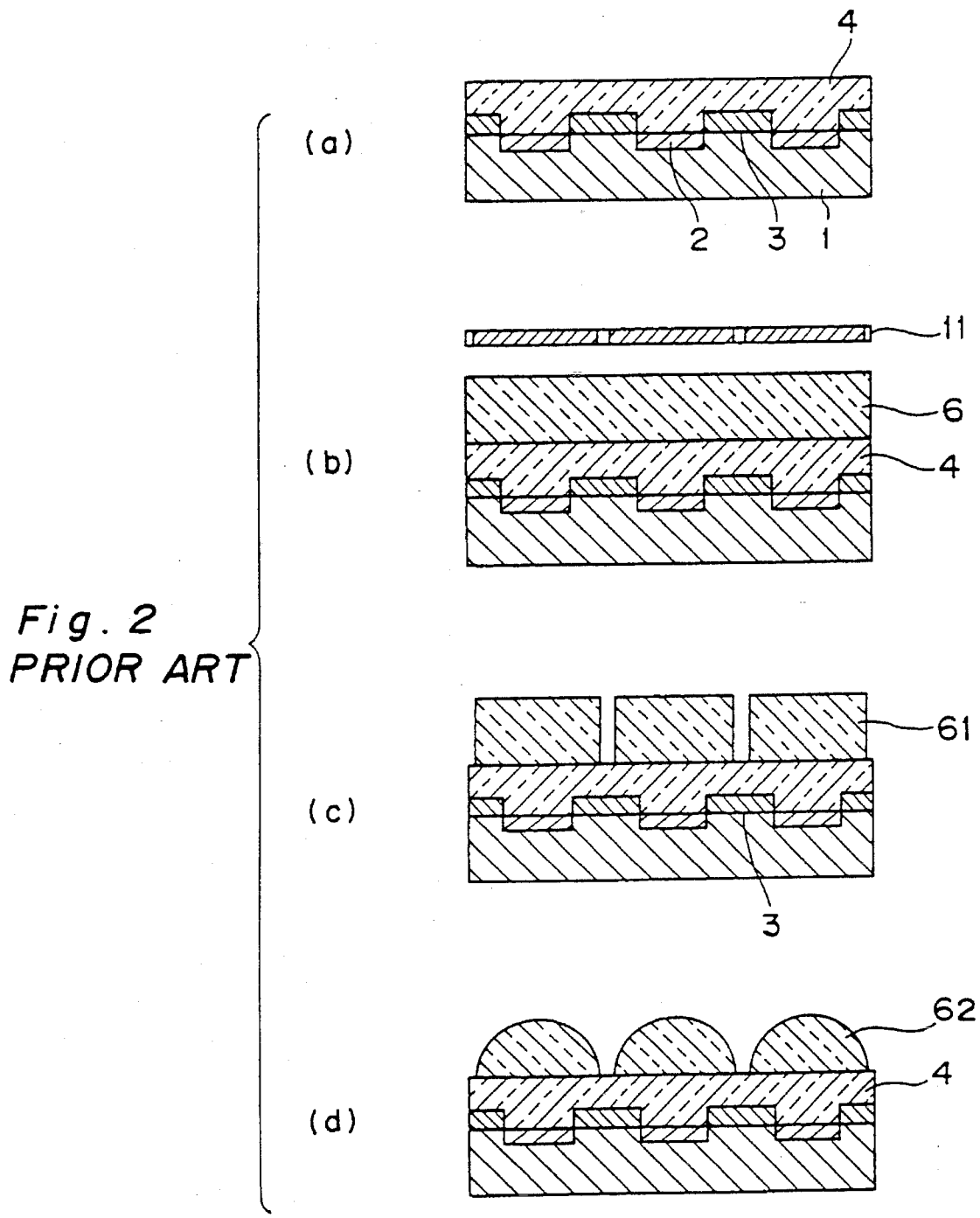
FIG. 2 is a process drawing showing a conventional solid state imaging device manufacturing method.
Figure 3:
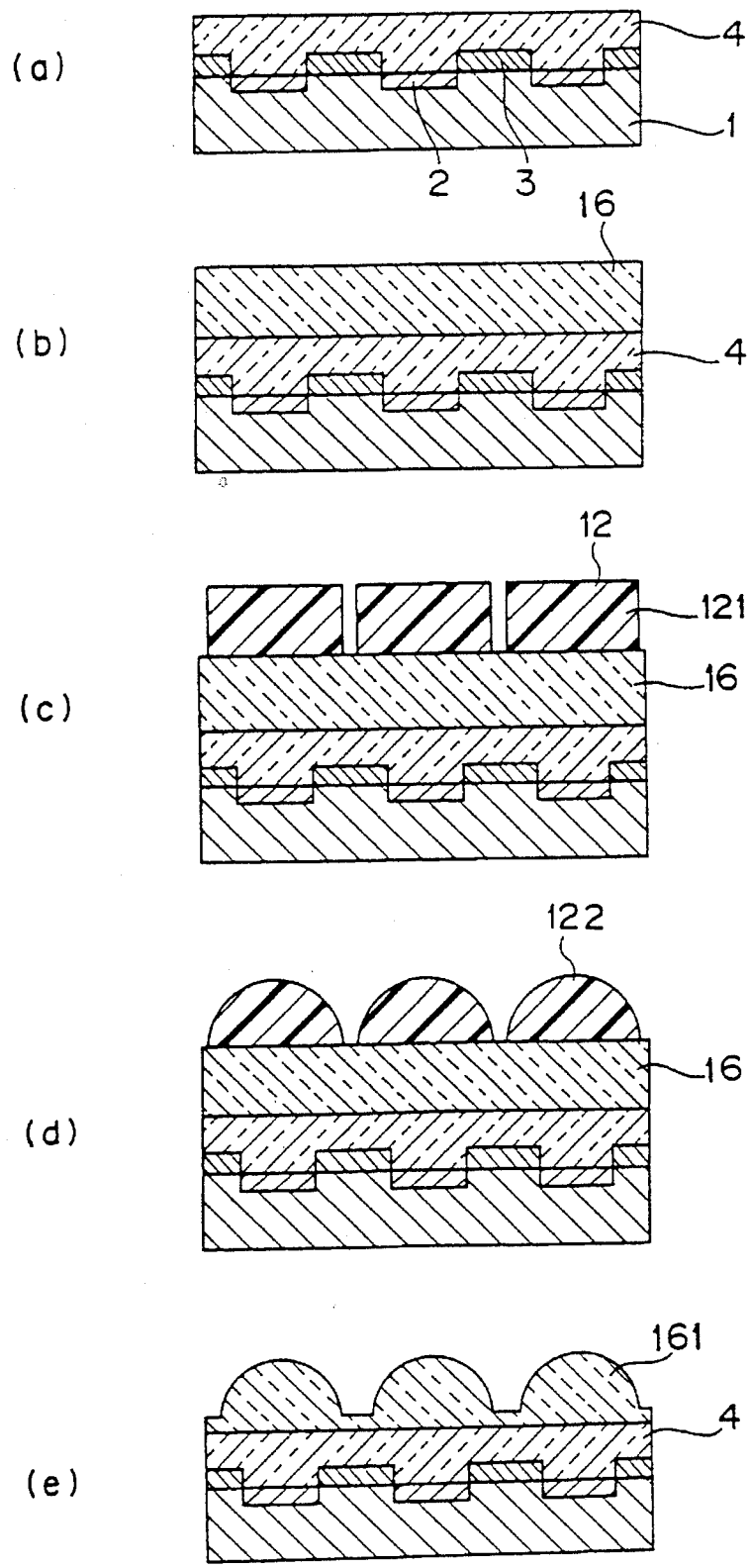
FIG. 3 is a process drawing showing another conventional solid state imaging device manufacturing method.

FIGS. 1(a) through 1(f) show the processes of a solid state imaging device manufacturing method in accordance with an embodiment of the present invention. In FIG. 1(a), there are shown a semiconductor substrate 1, approximately rectangular photodetecting portions 2 formed on the semiconductor substrate 1, and an electric charge transfer portion 3 which is formed on the semiconductor substrate 1 and is arranged adjacent to the photodetecting portions 2 and serves to transfer electric charges generated in the photodetecting portions 2. In order to suppress the difference in level between the photodetecting portions 2 and the electric charge transfer portion 3 below a specified value, an acrylic resin having a light transmitting property (e.g., FVR-10 manufactured by Fuji Yakuhin Kogyo K.K.) is coated by the spin coating method to a thickness of 2 μm and then thermally hardened at a temperature of 160° C. to form a flattening layer 4.

Then, in a manner as shown in FIG. 1(b), a colored acrylic resin is coated by the spin coating method to a thickness of 0.5 μm so as to cover the flattening layer 4 and then dried at a temperature of 160° C. to form a partition wall material layer 5. The colored acrylic resin is formed by incorporating 1 gram of carbon black into an acrylic resin using as a solvent ethyl Cellosolve acetate composed of 60 grams of polyglycidyl methacrylate and 40 grams of polymethyl methacrylate.

Then, in a manner as shown in FIG. 1(c), by coating an i-line positive type photoresist (not shown) (e.g., THMR-iP2000 manufactured by Tokyo Ohka Kogyo K.K.) to a thickness of 1.5 μm on the partition wall material layer 5 and performing patterning with an i-line stepper, a 0.4 mm-width grid-shaped mask pattern having squares corresponding to the photodetecting portions 2 is formed. By using the mask pattern and a gas containing argon as a main ingredient and including 3 percent of oxygen, a plurality of approximately rectangular regions of the partition wall material layer 5 of the colored acrylic resin on which micro lenses are formed are removed by sputter etching at a pressure of 5 mTorr to thereby form a rectangular grid-shaped partition wall 51.

Then, in a manner as shown in FIG. 1(d), a thermosoftening resin (e.g., RU-1100N manufactured by Hitachi Kasei K.K.) having a light transmitting property is coated by the spin coating method so as to cover the flattening layer 4 and the partition wall 51 to thereby form a thermosoftening resin layer 64.

Then, in a manner as shown in FIG. 1(e), the thermosoftening resin layer 64 is subjected to a selective exposure and development by means of a photomask (not shown) to remove the region of the thermosoftening resin layer 64 covering the partition wall 51 to thereby form a rectangular parallelepiped thermosoftening resin block 65 corresponding to each photodetecting portion 2.

Figure 5:
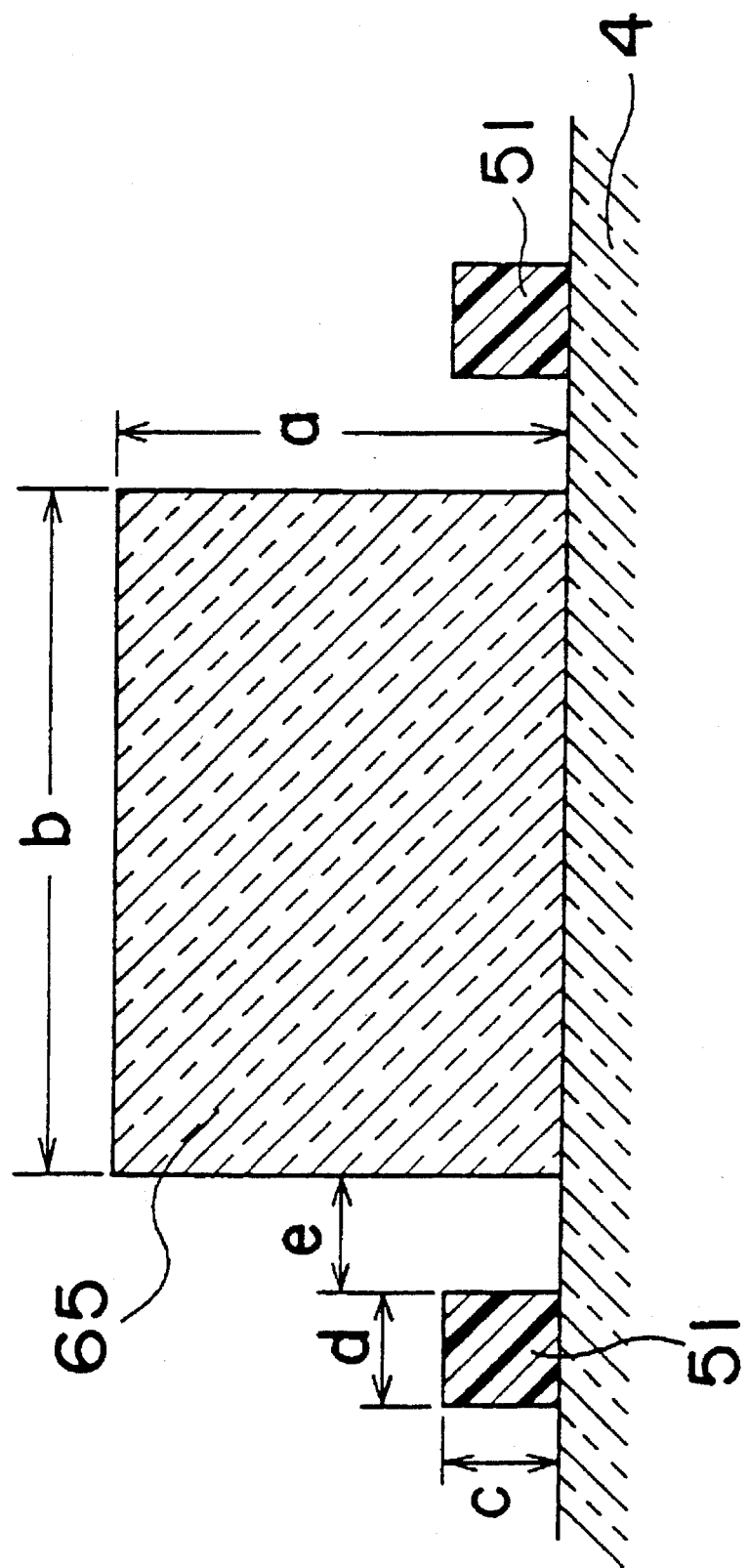
FIG. 5 is a view for explaining the sizes of a thermosoftening resin block and a partition wall.

Incidentally, FIG. 5 is an enlarged view of part of FIG. 1(e). The sizes of the partition wall 51 are decided according to dimensions a, b, and e illustrated in FIG. 5. In FIG. 5, it is preferable that $0.2 \mu m \leq c \leq 0.5 \mu m$, when $1 \mu m \leq a \leq 3 \mu m$, $b \geq 5 \mu m$, $e \geq 0.5 \mu m$ and $d \approx 0.3–0.7 \mu m$.

Then, in a manner as shown in FIG. 1(f), the thermosoftening resin block 65 is treated by heat for 30 minutes at a temperature of 160° C. to soften the corner portions thereof to be thermally transformed into an approximately hemispheric micro lens 66. In the above case, the periphery of the bottom portion of the micro lens 66 adheres to the interior surface of the partition wall 51 by the intermolecular attraction force exerted between the periphery and the partition wall 51 to spread inside the partition wall 51 without any gap. It should be noted that the micro lenses 66 are formed in correspondence with the photodetecting portions 2 and therefore they are arranged in a checkers pattern.

Figure 4A:
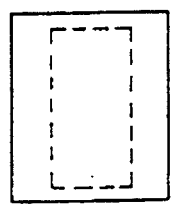
FIGS. 4(a) and 4(b) are schematic diagrams of the conventional solid state imaging device viewed from the side of the photodetecting surface.
Figure 4A:
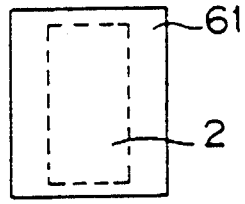
Figure 4A:
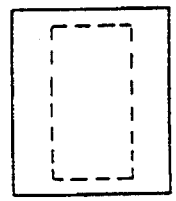
Figure 4A:
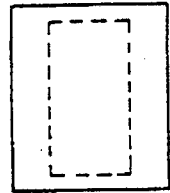
Figure 4B:
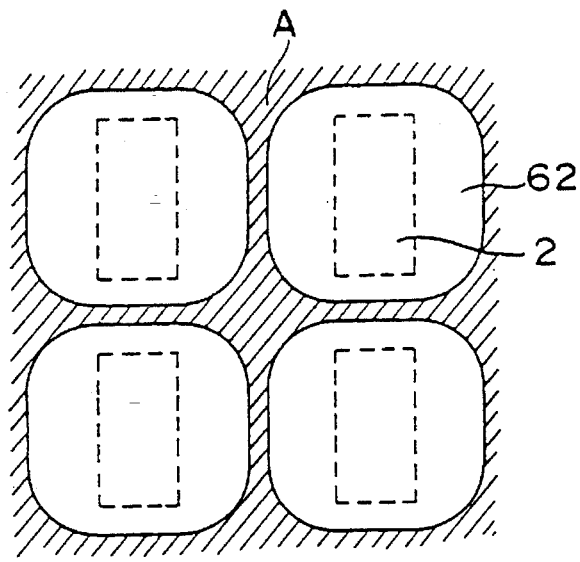
Figure 4C:
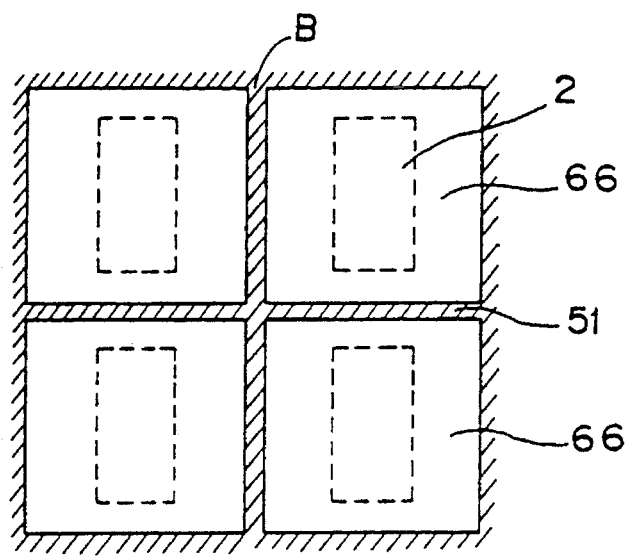
FIG. 4(c) is a schematic diagram of the solid state imaging device of the present invention viewed from the side of the photodetecting surface.

Thus the bottom portion of the micro lens 66 has a shape adhering to the interior surface of the partition wall 51 as shown in FIG. 4(c), with which the area of the ineffective region B where the micro lens 66 is not existing can be reduced and light incident on the electric charge transfer portion 3 can be efficiently collected to the photodetecting portions 2 to allow the sensitivity to be enhanced. Furthermore, the gap between adjacent micro lenses 66 and 66 can be reduced to the width of the partition wall 51, with which the gap between adjacent micro lenses 66 and 66 can be easily reduced more than is achieved in the conventional one to increase the light collection efficiency to the photodetecting portions 2 to allow the sensitivity to be enhanced.

In the above-mentioned embodiment, the ineffective region B as shown in FIG. 4(c) where incident light is not effectively utilized is reduced by 15 percent in comparison with the conventional ineffective area A as shown in FIG. 4(b), with which the light collection quantity of the micro lens 66 can be increased to allow the sensitivity to be enhanced by about 10 percent. Since the shape of the bottom portion of the micro lens 66 depends on the configuration of the partition wall 51, the uniformity of the micro lenses 66 is improved to result in improving the quality of images obtained by the solid state imaging device.

Furthermore, since the partition wall 51 is colored, light incident on the partition wall 51 is absorbed to prevent unnecessary light from entering into adjacent photodetecting portions 2. The above arrangement allows a solid state imaging device having a high image quality to be achieved.

Furthermore, since adjacent micro lenses 66 are partitioned by the partition wall 51, the peripheries of the micro lenses 66 can be correctly defined without nonuniformity even when a nonuniformity in fluidity of the thermosoftening resin or a nonuniformity in heating temperature control takes place. With the above-mentioned arrangement, fine and uniform micro lenses 66 can be manufactured to allow a high quality image to be obtained.

Although the solid state imaging device is a monochrome type in the above-mentioned embodiment, the present invention can be also applied to a color solid state imaging device having a color filter.

Although the partition wall material layer 5 is formed by incorporating carbon black into an acrylic resin in the above-mentioned embodiment, the material of the partition wall material layer 5 is of course not limited to the above-mentioned material.

Although the micro lenses 66 respectively have an approximately hemispheric bottom portion and are arranged in a checkers pattern in the above-mentioned embodiment, the shape and arrangement of the micro lenses are not limited to those as describe above, and the micro lenses may be approximately hemispheric micro lenses having approximately hexagonal bottom portions arranged in a honeycomb form.

As is evident from the above description, the solid state imaging device of the present invention is constructed so that a plurality of photodetecting portions and an electric charge transfer portion are formed on a substrate and, by virtue of micro lenses of which bottom portions are partitioned by a partition wall, light incident on the electric charge transfer portion is collected to the photodetecting portions.

Therefore, according to the solid state imaging device of the present invention, the shape of the bottom portion of each micro lens is fit close to the interior surface of the partition wall to allow the area where no micro lens is existing to be reduced, with which light incident on the electric charge transfer portion can be efficiently collected the photodetecting portions to allow its sensitivity to be enhanced. Furthermore, since the gap between adjacent micro lenses can be reduced to the width of the partition wall, the gap between micro lenses can be easily reduced, with which the efficiency of collecting light to the photodetecting portions can be increased to allow the sensitivity to be enhanced.

When the partition wall is colored, light incident on the partition wall is absorbed to allow possible entrance of unnecessary light into adjacent photodetecting portions to be prevented. The above-mentioned arrangement can achieve a solid state imaging device having a high image quality.

According to the solid state imaging device manufacturing method of the present invention, a plurality of photodetecting portions and an electric charge transfer portion are formed on a substrate, and after forming a flattening layer which has a light transmitting property and serves to cover the plural number of photodetecting portions and the electric charge transfer portion, a partition wall material layer for covering the flattening layer is formed. After forming a partition wall by removing a plurality of approximately polygonal regions of the partition wall material layer corresponding to the micro lenses, a resin layer which has a thermosoftening property and a light transmitting property and serves to cover the flattening layer and the partition wall is formed. Then the resin layer is separated into a plurality of blocks corresponding to the plural number of photodetecting portions by removing the region of the resin layer covering the partition wall, and the plural number of blocks are softened by heat application to be thermally transformed to thereby form a plurality of micro lenses of which bottom portions are peripherally partitioned by the partition wall.

According to the solid state imaging device manufacturing method of the present invention, the area of the region where no micro lens is existing can be reduced by reducing the width of the partition wall. Furthermore, since the micro lenses are partitioned by the partition wall, the peripheries of the micro lenses can be correctly defined without nonuniformity even when there is a nonuniformity in fluidity of the resin or a nonuniformity in heating temperature control. Therefore, the gap between micro lenses can be reduced to increase the light collection efficiency to thereby allow the sensitivity to be enhanced. Furthermore, fine and uniformed micro lenses can be manufactured to allow a high quality image to be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state imaging device manufacturing method comprising the steps of:

forming a plurality of photodetecting portions and an electric charge transfer portion on a substrate;

forming a flattening layer which has a light transmitting property and serves to cover the plurality of photodetecting portions and the electric charge transfer portion;

forming a partition wall material layer for covering the flattening layer;

removing a plurality of approximately polygonal regions of the partition wall material layer corresponding to micro lens to form a partition wall;

forming a resin layer which has a thermosoftening property and a light transmitting property and serves to cover the flattening layer and the partition wall;

separating the resin layer into a plurality of blocks corresponding to the plurality of photodetecting portions by removing a region of the resin layer covering the partition wall; and thermally softening the plurality of blocks by heat application to transform the blocks into the plurality of micro lenses of which bottom portions are partitioned by the partition wall.

* * * * *